US011229145B2

United States Patent
Peng et al.

(10) Patent No.: US 11,229,145 B2
(45) Date of Patent: Jan. 18, 2022

(54) AIR BAFFLE COMPONENT, HEAT DISSIPATION APPARATUS, AND SERVER

(71) Applicant: HUAWEI TECHNOLOGIES CO., LTD., Shenzhen (CN)

(72) Inventors: Huan Peng, Dongguan (CN); Gaoliang Xia, Dongguan (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 0 days.

(21) Appl. No.: 16/911,030

(22) Filed: Jun. 24, 2020

(65) Prior Publication Data

US 2020/0323106 A1   Oct. 8, 2020

Related U.S. Application Data

(63) Continuation of application No. PCT/CN2019/083619, filed on Apr. 22, 2019.

(30) Foreign Application Priority Data

Apr. 25, 2018 (CN) .......................... 201810380115.6

(51) Int. Cl.
H05K 7/20 (2006.01)
G06F 1/20 (2006.01)

(52) U.S. Cl.
CPC ........... *H05K 7/20727* (2013.01); *G06F 1/20* (2013.01); *H05K 7/20145* (2013.01)

(58) Field of Classification Search
CPC .. H05K 7/20727; H05K 7/20145; G06F 1/20; G06F 1/181
See application file for complete search history.

(56) References Cited

U.S. PATENT DOCUMENTS

| 6,058,011 | A | 5/2000 | Hardt et al. |
| 7,646,601 | B2 * | 1/2010 | Zhang ........................ G06F 1/20 |
| | | | 361/695 |
| 8,638,554 | B2 * | 1/2014 | Wei ..................... H05K 7/20727 |
| | | | 361/679.49 |
| 9,433,131 | B2 * | 8/2016 | Joko ................... H05K 7/20736 |

(Continued)

FOREIGN PATENT DOCUMENTS

| CN | 2665799 Y | 12/2004 |
| CN | 101458546 A | 6/2009 |

(Continued)

OTHER PUBLICATIONS

Hu, Tseng-Hsun; Hung, Shih-Wei; Kent, Machrus; Yang, Cheng-Feng, "Structure of anti-backflow baffle inside chassis", Nov. 21, 2016, Chenbro Micom Co Ltd, Entire Document (Translation of TWM 532715). (Year: 2016).*

(Continued)

*Primary Examiner* — Stephen S Sul (74) *Attorney, Agent, or Firm* — Hauptman Ham, LLP (57) ABSTRACT

An air baffle component includes an air baffle rotationally connected to a housing of a device chassis having a module insertion port. The air baffle component also includes a level-1 elastic component. The air baffle component further includes a level-2 elastic component. The air baffle component additionally includes a connecting rod. The connecting rod includes a force-bearing rod rotationally connected to the housing of the device chassis between the air baffle and the module insertion port. The connecting rod also includes a pull rod connected to the force-bearing rode. The connecting rod further includes a baffle column on the pull rod. The level-1 elastic component provides a first elastic force for the force-bearing rod, so that the baffle column is caused to abut against a surface of the air baffle opposite to the module insertion port. The level-2 elastic component provides a second elastic force for the air baffle.

19 Claims, 8 Drawing Sheets

(56) References Cited

U.S. PATENT DOCUMENTS

| | | | |
|---|---|---|---|
| 9,915,985 B1* | 3/2018 | Chen | H05K 7/20727 |
| 9,961,796 B1* | 5/2018 | Peng | H05K 7/20145 |
| 10,154,606 B1* | 12/2018 | Liu | H05K 7/1487 |
| 2007/0053143 A1 | 3/2007 | Kang | |
| 2009/0154114 A1 | 6/2009 | Peng et al. | |
| 2009/0161310 A1 | 6/2009 | Peng et al. | |
| 2009/0168328 A1 | 7/2009 | Peng et al. | |
| 2010/0089549 A1* | 4/2010 | Su | F04D 29/441 165/80.3 |
| 2011/0053485 A1* | 3/2011 | Huang | H05K 7/20145 454/184 |
| 2012/0132598 A1* | 5/2012 | Wang | H05K 7/1487 211/26 |
| 2012/0155021 A1* | 6/2012 | Wei | H05K 7/20727 361/690 |
| 2012/0155033 A1* | 6/2012 | Li | G06F 1/187 361/726 |
| 2013/0163199 A1* | 6/2013 | Chen | H05K 7/20145 361/690 |
| 2014/0364048 A1* | 12/2014 | Milligan | H05K 7/20736 454/184 |
| 2015/0055296 A1* | 2/2015 | Joko | H05K 7/20145 361/695 |
| 2018/0095508 A1* | 4/2018 | Yi | H05K 7/20163 |

FOREIGN PATENT DOCUMENTS

| | | | |
|---|---|---|---|
| CN | 101470482 A | 7/2009 | |
| CN | 101470488 A | 7/2009 | |
| CN | 102480890 A | 5/2012 | |
| CN | 202887092 U | 4/2013 | |
| CN | 104142714 A | 11/2014 | |
| CN | 205124204 U | 3/2016 | |
| CN | 206805403 U | 12/2017 | |
| CN | 108563297 A | 9/2018 | |
| TW | M532715 U | * 11/2016 | H05K 7/20 |

OTHER PUBLICATIONS

Nemati et al., K., "Experimental Characterization of the Rear Door Fans and Heat Exchanger of a Fully-Enclosed, Hybrid-Cooled Server Cabinet," Department of Mechanical Engineering, Binghamton University—SUNY, Binghamton, New York.

Peng et al., L., "The Optimization Design of Electronic Equipments' Case Based on Multi-field-coupled Model," School of Electromechanical Engineering, Xidian University, Xi'an, China.

International Search Report issued in corresponding International Application No. PCT/CN2019/083619, dated Jul. 25, 2019, pp. 1-10, National Intellectual Property Administration, Beijing, China.

First Chinese Office Action issued in corresponding Chinese Application No. 201810380115.6, dated Oct. 9, 2019, pp. 1-10, The State Intellectual Property Office of People's Republic of China, Beijing, China.

Second Chinese Office Action issued in corresponding Chinese Application No. 201810380115.6, dated Jul. 1, 2020, pp. 1-5, The State Intellectual Property Office of People's Republic of China, Beijing, China.

* cited by examiner

AIR BAFFLE COMPONENT, HEAT DISSIPATION APPARATUS, AND SERVER

CROSS-REFERENCE TO RELATED APPLICATIONS

This application is a continuation of International Application No. PCT/CN2019/083619, filed on Apr. 22, 2019, which claims priority to Chinese Patent Application No. 201810380115.6, filed on Apr. 25, 2018. The disclosures of the aforementioned applications are hereby incorporated by reference in their entireties.

TECHNICAL FIELD

This application relates to the field of electronic device technologies, and in particular, to an air baffle component, a heat dissipation apparatus, and a server.

BACKGROUND

A modular server modularizes and independently separates components such as a storage component, a computing component, a network component, and a management component, and uses an independent management module to manage the components in a sharing manner. The modular server includes a plurality of independent modules, such as a computing module, a storage module, a heat dissipation module, a power supply module, and a network module. Each module adopts a redundancy and hot swap design, which can be flexibly expanded. When some modules are faulty, the faulty modules may be independently replaced without affecting normal working of other modules. Therefore, the modular server is widely popularized because the modular server supports flexible configuration, hot swap, and independent maintenance.

During module replacement and maintenance, an air baffle is disposed between modules to ensure that air in an air duct does not affect normal running of other modules in the modular server. When a module is inserted, resistance of the air baffle needs to be overcome. However, with improvement of performance of the modular server, power consumption of the modular server is increasingly high. To prevent the module in the modular server from being overheated, a wind speed of a heat dissipation fan in the heat dissipation module is increased. To ensure a baffle function of the air baffle, a support force provided for the air baffle needs to be increased. Therefore, when the module is inserted, the resistance that needs to be overcome increases, and the insertion of the module becomes laborious and inconvenient.

SUMMARY

This application provides an air baffle component, a heat dissipation apparatus, and a server, to resolve a prior-art problem that insertion of a module is laborious.

According to a first aspect, an embodiment of this application provides an air baffle component, applied to a device chassis. The device chassis has a module insertion port. The air baffle component includes an air baffle, a connecting rod, a level-1 elastic component, and a level-2 elastic component. The connecting rod includes a force-bearing rod that is rotationally connected to a housing of the device chassis and a pull rod that is connected to the force-bearing rod. A baffle column is disposed on the pull rod. For example, the baffle column is disposed on a top of the pull rod. The level-1 elastic component contacts the connecting rod and the housing, and is configured to provide an elastic force for the force-bearing rod, so that the baffle column on the pull rod abuts against a surface that is of the air baffle and that is opposite to the insertion port. For example, the level-1 elastic component may contact the force-bearing rod and the housing. The force-bearing rod is located between the air baffle and the insertion port. In other words, the force-bearing rod is located before the air baffle in a module insertion direction. The air baffle is rotationally connected to the housing, and the level-2 elastic component contacts the housing and the air baffle, and is configured to provide an elastic force for the air baffle to support the air baffle, so that the air baffle blocks air that enters the insertion port.

In the foregoing manner, the connecting rod may provide a support force for the air baffle by using the level-1 elastic component, and the level-2 elastic component may directly provide a support force for the air baffle. In this way, the air baffle can better implement a baffle function. When a module is inserted, the module only needs to sequentially overcome the support force provided by the level-1 elastic component and the support force provided by the level-2 elastic component, and a force that needs to be overcome by the inserted module is divided into a plurality of relatively small forces. In this way, insertion of the module becomes labor-saving.

In a possible implementation, when the module is inserted into the insertion port, the module pushes the force-bearing rod, and after the pull rod on the connecting rod rotates to the housing, the module contacts the air baffle. A force-applying arm of the module for pushing the force-applying rod is greater than a force-applying arm of the level-1 elastic component.

In the foregoing manner, when the module is inserted, the module first contacts the force-bearing rod, and after the connecting rod reaches a relatively large movement limit, the module pushes the air baffle. In this way, when the module is inserted, the module only needs to sequentially overcome the support force of the level-1 elastic component and the support force of the level-2 elastic component. This can ensure that insertion of the module is relatively labor-saving. The force-applying arm of the module for pushing the force-applying rod is greater than the force-applying arm of the level-1 elastic component, which ensures that a force-saving lever is formed when the module is inserted, and the insertion of the module is relatively labor-saving.

In a possible implementation, when the module is inserted into the air baffle, after the top of the pull rod rotates to the housing, the module contacts the air baffle, and the top of the force-bearing rod contacts a bottom of the module.

In the foregoing manner, when the top of the pull rod rotates to the housing, the connecting rod may reach a maximum movement limit, and the connecting rod no longer continues to move. When the top of the force-bearing rod contacts the bottom of the module, gravity of the module applies force on the force-bearing rod in a vertical direction, so that the connecting rod is kept to the maximum movement limit without providing an additional thrust.

In a possible implementation, the force-bearing rod is rotationally connected to the housing by using a first rotating shaft. The level-1 elastic component may include one or more first torsion springs, the first torsion spring is sleeved on the first rotating shaft, and two ends of the first torsion spring respectively abut against the connecting rod and the housing.

In the foregoing manner, the connecting rod provides a support force for the air baffle by using the first torsion spring. This ensures that the air baffle has a normal baffle function. When the module is inserted, the module only needs to first overcome the support force provided by the first torsion spring, and then overcome the support force provided by the level-2 elastic component. In this way, the module can be easily inserted.

In a possible implementation, the level-1 elastic component may include one or more first tension springs, and two ends of the first tension spring are respectively connected to the connecting rod and the housing.

In the foregoing manner, the connecting rod provides a support force for the air baffle by using the first tension spring, so as to ensure that the air baffle can normally block air. When the module is inserted, the module only needs to sequentially overcome the support force provided by the first tension spring and the support force provided by the level-2 elastic component, to ensure that the insertion of the module becomes labor-saving.

In a possible implementation, the level-1 elastic component may include one or more first compression springs, and two ends of the first compression spring are respectively connected to the connecting rod and the housing.

In the foregoing manner, the connecting rod provides a support force for the air baffle through compression deformation of the first compression spring, so that it can be ensured that the air baffle has a sufficient support force. When the module is pushed into the insertion port, the module only needs to sequentially overcome the support force provided by the first compression spring and the support force provided by the level-2 elastic component. In this way, the insertion of the module into the device chassis is relatively labor-saving.

In a possible implementation, the connecting rod is located on a side wall of the housing. In other words, the connecting rod is close to the side wall of the housing, and may be located on a side surface of the air baffle.

In the foregoing manner, the connecting rod is located on the side wall of the housing, and does not need to occupy relatively large space. This effectively saves space in the device chassis.

In a possible implementation, there may be a plurality of types of connecting rods, and the connecting rods may be some or all of the following: a T-shaped connecting rod, an S-shaped connecting rod, a circular connecting rod, and an abnormal-shape connecting rod.

In the foregoing manner, the connecting rod may have a plurality of shapes, to facilitate flexible disposing of the air baffle.

In a possible implementation, a length of the force-bearing rod is greater than the force-applying arm of the level-1 elastic component.

In the foregoing manner, when the module is inserted, the module pushes the connecting rod, and a force-saving lever is easily formed. In this way, the module is more easily inserted into the device chassis.

In a possible implementation, the air baffle is rotationally connected to the housing of the device chassis by using a second rotating shaft. The level-2 elastic component may include one or more second torsion springs, the second torsion spring is sleeved on the second rotating shaft, and two ends of the second torsion spring respectively abut against the air baffle and the housing.

In the foregoing manner, the second torsion spring is used to provide a support force for the air baffle, so that it can be ensured that the air baffle can normally block air. When the module is inserted, the module only needs to sequentially overcome the support force provided by the level-1 elastic component and the support force provided by the second torsion spring. This ensures that the insertion of the module becomes labor-saving.

In a possible implementation, the level-2 elastic component may include one or more second tension springs, and two ends of the second tension spring are respectively connected to the air baffle and the housing.

In the foregoing manner, a support force is provided for the air baffle through tensile deformation of the second tension spring, so that it can be ensured that the air baffle can have a sufficient support force. When the module is inserted, the module only needs to sequentially overcome the support force provided by the level-1 elastic component and the support force provided by the second tension spring. This further ensures that the insertion of the module becomes labor-saving.

In a possible implementation, the level-2 elastic component may include one or more second compression springs, and two ends of the second compression spring are respectively connected to the air baffle and the housing.

In the foregoing manner, a support force is provided for the air baffle through compression deformation of the second compression spring, so that it can be ensured that the air baffle has a relatively good baffle function. When the module is inserted, the module only needs to sequentially overcome the support force provided by the level-1 elastic component and the support force provided by the second compression spring. This ensures that the insertion of the module becomes labor-saving.

According to a second aspect, this application further provides a heat dissipation apparatus, including the air baffle component provided in the first aspect and any implementation of the first aspect.

According to a third aspect, this application further provides a server, including the heat dissipation apparatus provided in the second aspect.

DESCRIPTION OF EMBODIMENTS

This application provides an air baffle component, to resolve a prior-art problem that insertion of a module is laborious. The following clearly describes the technical solutions in the embodiments of this application with reference to the accompanying drawings in the embodiments of this application.

Figure 1:
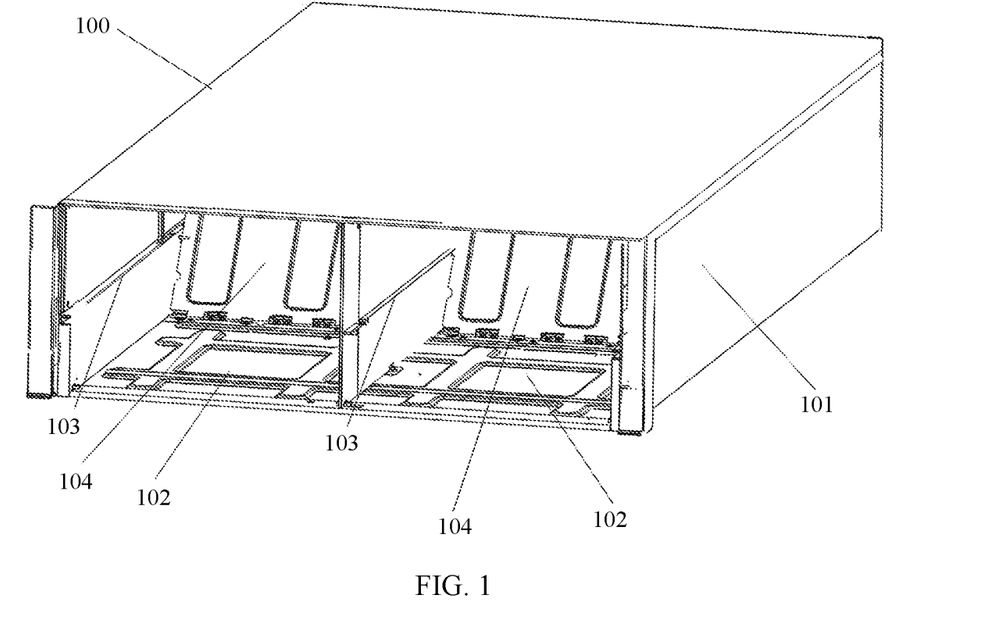
FIG. 1 is a schematic structural diagram of a modular server, in accordance with one or more embodiments.

FIG. 1 is a schematic structural diagram of a device chassis having a module insertion port in a modular server. An outer layer of the modular server 100 is a housing 101 of the modular server 100. As shown in FIG. 1, the modular server 100 includes two module insertion ports 102, and a plurality of modules may be inserted into the module insertion port 102. The module insertion port 102 shown in FIG. 1 has a guide rail 103. When a module is inserted into the insertion port 102, the insertion port 102 may be inserted into the modular server 100 along the guide rail 103.

The insertion port 102 further includes an air baffle 104. When no module is inserted into the insertion port 102, the air baffle 104 blocks air that enters from the insertion port 102, to prevent air from entering from the module insertion port 102. This avoids a situation that an air duct is short-circulated, the air cannot flow to another air duct, and other modules in the modular server 100 cannot normally dissipate heat. When a module is inserted into the module insertion port 102, the module enters the module insertion port 102 along the guide rail, and pushes the air baffle 104 until the module is completely inserted. In a process of inserting the module, the air baffle 104 generates resistance to some extent.

Conventionally, a relatively large force is usually applied to support the air baffle 104, causing difficulty in inserting a module. Therefore, this embodiment of this application provides an air baffle component, which may be applied to the device chassis having the module insertion port, in this embodiment of this application, an example in which the air baffle component is applied to the modular server shown in FIG. 1 is merely used for description. It should be noted that the air baffle component provided in this embodiment of this application is not limited to being applied to another device. When the air baffle component is applied to another device, refer to this embodiment of this application.

Figure 2:
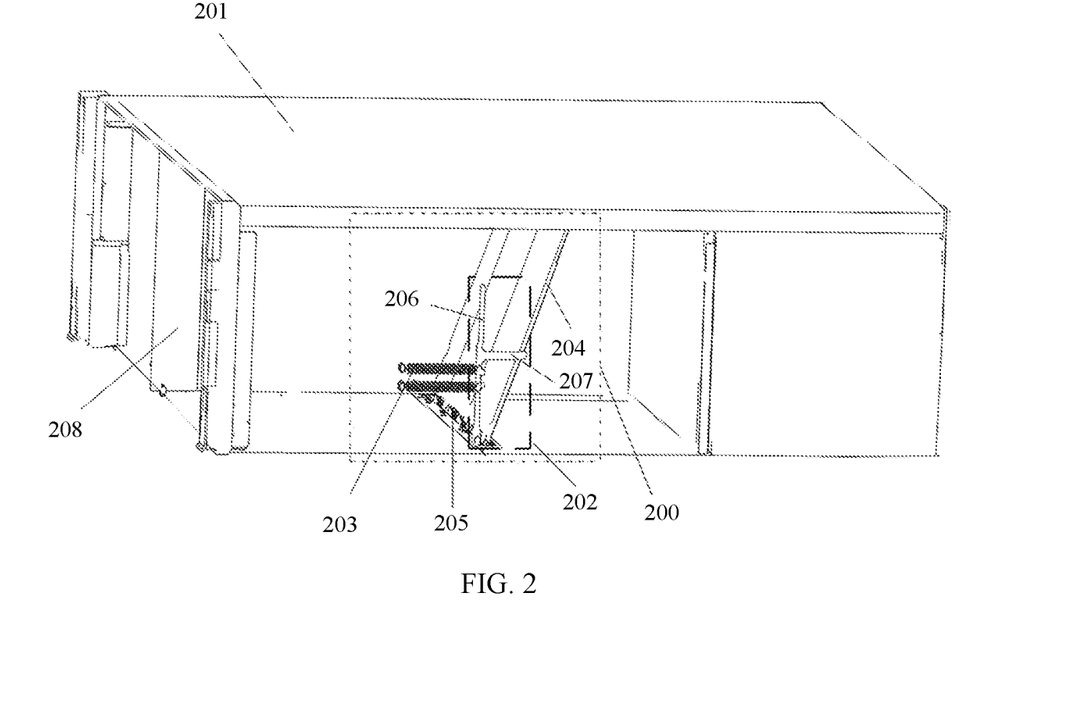
FIG. 2 is a schematic structural diagram of an air baffle component, in accordance with one or more embodiments.

As shown in FIG. 2, an embodiment of this application provides an air baffle component 200. The air baffle component 200 is located in a device chassis 201. For ease of description, the air baffle component 200 is divided into a multi-level elastic structure. A level-1 elastic structure includes a connecting rod 202 and a level-1 elastic component 203, and a level-2 elastic structure includes an air baffle 204 and a level-2 elastic component 205.

The air baffle component 200 may include a plurality of level-1 elastic structures. In other words, the air baffle component 200 may include a plurality of connecting rods 202 and a plurality of level-1 elastic components 203, and the plurality of refers to two or more than two.

In the level-1 elastic structure, the connecting rod 202 includes a force-bearing rod 206 that is rotationally connected to a housing and a pull rod 207 that is connected to the force-bearing rod 206. A baffle column is disposed on the pull rod 207. The baffle column abuts against a surface that is of the air baffle 204 and that is opposite to an insertion port 208, and contacts the connecting rod 202 and the housing of the device chassis 201 by using the level-1 elastic component 203, to provide an elastic force for the force-bearing rod 206. The level-1 elastic component 203 is connected to the connecting rod 202 and the housing of the device chassis 201, so that the baffle column abuts against the surface that is of the air baffle 204 and that is opposite to the insertion port 208. When air enters the insertion port 208, the baffle column on the pull rod 207 abuts against a back-air surface of the air baffle 204, and provides a support force for the air baffle 204 by using the level-1 elastic component 203, so that the air baffle 204 can block the air that enters the insertion port 208. The baffle column may be located on a top of the pull rod 207, or may be located on a middle position of the pull rod 207. The level-1 elastic component 203 is in contact with or connected to the force-bearing rod 206 on the connecting rod 202.

The force-bearing rod 206 is located before the air baffle 204 in a module insertion direction. In other words, the force-bearing rod 206 is located between the air baffle 204 and the insertion port 208. When a module is inserted from the insertion port 208 along a guide rail, the module first contacts the force-bearing rod 206 located before the air baffle 204, and then contacts the air baffle 204.

It should be understood that the level-1 elastic component 203 is a component that can provide the elastic force for the force-bearing rod 206 to support the air baffle 204. In FIG. 2, an example in which the level-1 elastic component 203 includes two tension springs is used. A specific shape of and a position for disposing the level-1 elastic component 203 are not limited herein. For example, the level-1 elastic component 203 may be a tension spring, a compression spring, a torsion spring, an air spring, or a rubber spring. The position of the level-1 elastic component 203 may be determined based on a specific scenario and a feature of the level-1 elastic component 203. Any element that can elastically deform to provide the elastic force for the force-bearing rod to support the air baffle may be used as the level-1 elastic component.

It should be noted that one end of the level-1 elastic component 203 contacts the connecting rod 202, and the other end contacts the housing of the device chassis 201. In other words, the level-1 elastic component 203 has contact points with the connecting rod 202 and the housing. One end of the level-1 elastic component 203 is fastened to the connecting rod 202, and the other end is fastened to the housing. The level-1 elastic component cannot be separated from the connecting rod 202 or the housing. For example, the level-1 elastic component 202 is connected to the connecting rod 202 or the housing in a welding manner. Alternatively, one end of the level-1 elastic component 203 is detachably connected to the connecting rod 202, and the other end is detachably connected to the housing of the device chassis 201. In addition, this connection manner may be separated. The connecting rod 202 has a contact point with the level-1 elastic component 203, and when connection is not required, the connecting rod 202 may be separated from the level-1 elastic component 203. For example, a spring hook is disposed on the force-bearing rod 206 and the housing, and the level-1 elastic component 203 may be connected to the force-bearing rod 206 and the housing by using the spring hook. When connection is not required, the level-1 elastic component 203 may be removed from the spring hook. For another example, when the level-1 elastic component 203 is the rubber spring, one end may be connected to the housing, and the other end may contact the force-bearing rod 206 by abutting against behind the force-bearing rod 206, so that the level-1 elastic component 203 contacts the rubber spring, and the force-bearing rod 206 may obtain the elastic force by pressing the rubber spring. The foregoing connection manners are all examples. Any connection manner in which the level-1 elastic component is connected to the connecting rod and the housing to provide the elastic force for the force-bearing rod is applicable to this embodiment. Regardless of which connection manner is used, the level-1 elastic component contacts the connecting rod and the housing of the device chassis. A specific contact manner may be set based on an actual application scenario and a feature of the level-1 elastic component.

In the level-2 elastic structure, the air baffle 204 is rotationally connected to the housing of the device chassis 201, and the air baffle 204 rotates by using a joint with the housing as an axis. To ensure that the air baffle 204 can block air that enters the insertion port 208 in the device chassis, the level-2 elastic component 205 contacts the housing of the device chassis 201 and the air baffle 204, to provide the elastic force for the air baffle 204. The level-2 elastic component 205 is connected to the housing of the device chassis 201 and the air baffle 204.

In FIG. 2, an example in which the level-2 elastic component 205 includes a plurality of torsion springs is used. A specific shape of and a position for disposing the level-2 elastic component 205 are not limited herein. For example, the level-2 elastic component 205 may be a tension spring, a compression spring, a torsion spring, an air spring, or a rubber spring. The position of the level-2 elastic component 205 may be determined based on a specific scenario and a feature of the level-2 elastic component. Any element that can elastically deform to provide the elastic force for the air baffle may be used as the level-2 elastic component.

It should be noted that one end of the level-2 elastic component 205 contacts the air baffle 204, and the other end contacts the housing of the device chassis 201. In other words, the level-2 elastic component 205 has contact points with the air baffle 204 and the housing. One end of the level-2 elastic component 205 is fastened to the air baffle 204, and the other end is fastened to the housing. The level-2 elastic component cannot be separated from the air baffle 204 or the housing. For example, the level-2 elastic component 202 is connected to the air baffle 204 or the housing in a welding manner. Alternatively, one end of the level-2 elastic component 205 is detachably connected to the air baffle 204, and the other end is detachably connected to the housing of the device chassis 201. In addition, this connection manner may be separated. The air baffle 204 has a contact point with the level-2 elastic component, and when connection is not required, the level-2 elastic component 205 may be separated from the air baffle 204. For example, a spring hook is disposed on the air baffle 204 and the housing, and the level-2 elastic component 205 may be connected to the air baffle 204 and the housing by using the spring hook. When connection is not required, the level-2 elastic component 205 may be removed from the spring hook. For another example, when the level-2 elastic component 205 is the rubber spring, one end may be connected to the housing, and the other end may abut against behind the air baffle 204, so that the level-2 elastic component 205 contacts the rubber spring, and the air baffle 204 may obtain the elastic force by pressing the rubber spring. The foregoing connection manners are all examples. Any connection manner in which the level-2 elastic component 205 is connected to the air baffle 204 and the housing to provide the elastic force for the air baffle 204 is applicable to this embodiment. Regardless of which connection manner is used, the level-2 elastic component 205 contacts the air baffle 204 and the housing of the device chassis 201. A specific contact manner may be set based on an actual application scenario and a feature of the level-2 elastic component 203.

There are a plurality of specific shapes of and positions for disposing the level-1 elastic component. The following lists three disposition manners of the level-1 elastic component in the level-1 elastic structure.

Figure 3A:
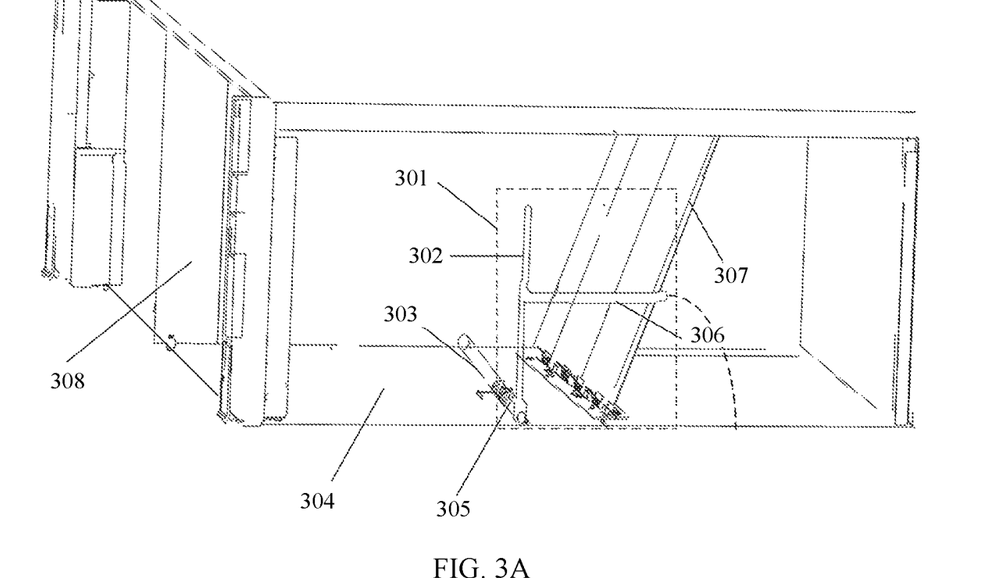
FIG. 3A to FIG. 3C are schematic structural diagrams of a level-1 elastic component, in accordance with one or more embodiments.

In a first manner, the level-1 elastic component includes a first torsion spring.

As shown in FIG. 3A, a force-bearing rod 302 on a connecting rod 301 is rotationally connected to a housing 304 by using a first rotating shaft 303. The level-1 elastic component includes one or more first torsion springs 305. In FIG. 3A, an example in which the level-1 elastic component includes one first torsion spring 305 is used for description, and the first torsion spring 305 is sleeved on the first rotating shaft 303. Two ends of the first torsion spring 305 respectively abut against the connecting rod 301 and the housing 304.

A baffle column disposed on a pull rod 306 abuts against a surface that is of an air baffle 307 and that is opposite to an insertion port 308.

When a module is inserted from the insertion port 308, the module contacts the force-bearing rod 302, to push the connecting rod 301 to move, and the pull rod 306 rotates away from a back-air surface of the air baffle 307. A dashed line shown in FIG. 3A is a moving track of a vertex of the pull rod 306. Finally, the pull rod 306 rotates to the housing 304, and the connecting rod 301 reaches a maximum movement limit.

Figure 3B:
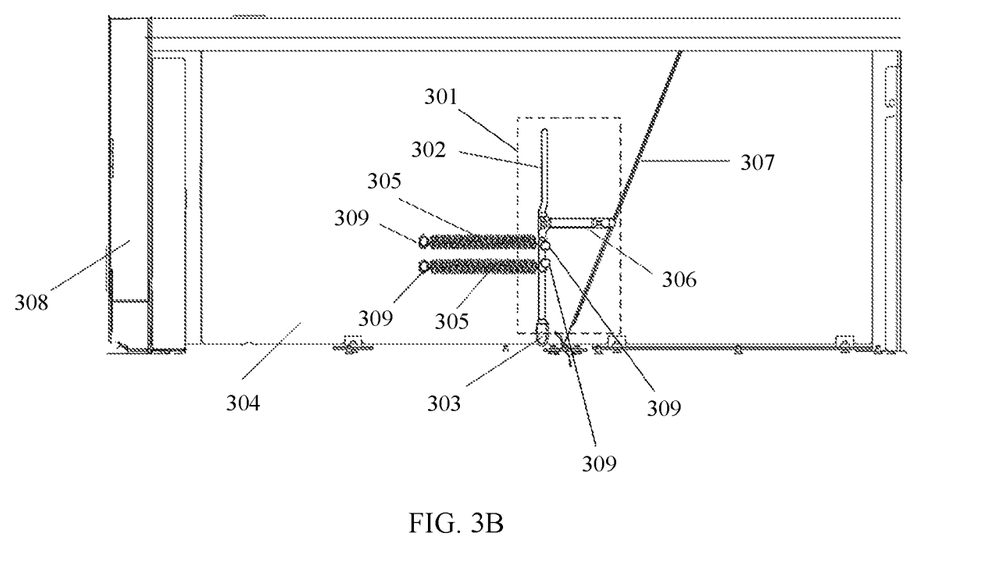

In a second manner, the level-1 elastic component includes a first tension spring.

As shown in FIG. 3B, the force-bearing rod 302 on the connecting rod 301 is rotationally connected to the housing 304 by using the first rotating shaft 303. The level-1 elastic component includes one or more first tension springs 305. In FIG. 3B, an example in which the level-1 elastic component includes two first tension springs 305 is used for description. Two ends of the first tension spring 305 are respectively connected to the connecting rod 301 and the housing 304.

Because the level-1 elastic component provides an elastic force for the force-bearing rod 302, and the baffle column on the pull rod 306 abuts against a surface that is of the air baffle 307 and that is opposite to the insertion port 308, the first tension spring 305 may provide a pulling force for the connecting rod 301 through tensile deformation. In this way, the baffle column on the pull rod 306 may provide a support force for the surface that is of the air baffle 307 and that is opposite to the insertion port 308.

One end of the first tension spring 305 needs to be connected to the connecting rod 301. For example, a spring hook 309 is disposed on the connecting rod 301, and one end of the first tension spring 305 is hooked on the spring hook 309 on the connecting rod 301. The other end of the first tension spring 305 needs to be connected to the housing 304. To ensure that the first tension spring 305 has tensile deformation, to provide the support force of the pull rod 306 for the air baffle 307, a position at which the other end of the first tension spring 305 is connected to the housing 304 should face the insertion port 308 and before the connecting rod 301. As shown in FIG. 3B, the spring hook 309 is also disposed on the housing 304 on a side surface of the device chassis before the connecting rod 301, and the other end of the first tension spring 305 is hooked on the spring hook 309 on the housing 304. Alternatively, the spring hook 309 may be disposed on the housing 304 at a bottom of the device chassis before the connecting rod 301, and the other end of the first tension spring 305 is hooked on the spring hook 309 on the housing 304.

Figure 3C:
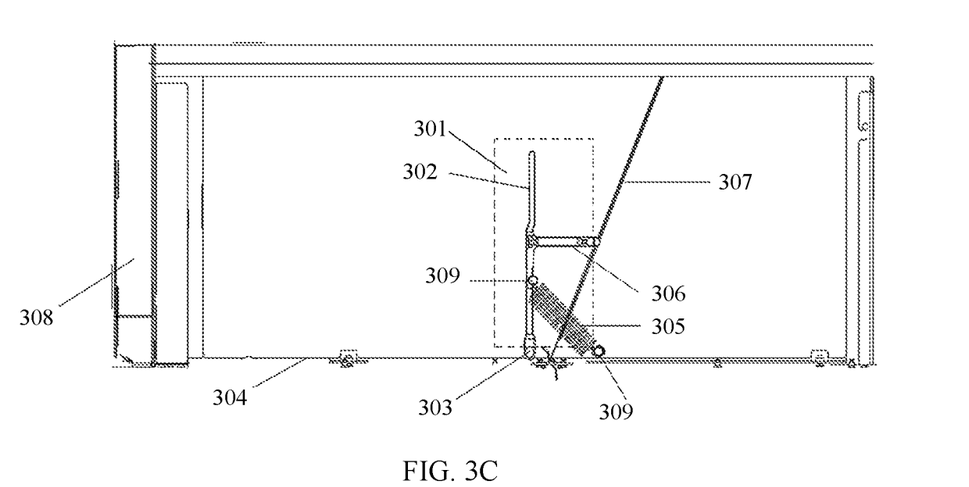

In a third manner, the level-1 elastic component includes a first compression spring.

As shown in FIG. 3C, the force-bearing rod 302 on the connecting rod 301 is rotationally connected to the housing 304 by using the first rotating shaft 303. The level-1 elastic component includes one or more first compression springs 305. In FIG. 3C, an example in which the level-1 elastic component include one first compression spring 305 is used for description. Two ends of the first compression spring 305 are respectively connected to the connecting rod 301 and the housing 304.

Because the level-1 elastic component enables the baffle column on the pull rod 306 to abut against the back-air surface of the air baffle 307, two ends of the first compression spring 305 need to abut between the connecting rod 301 and the housing 304, and the first compression spring 305 should be disposed away from the insertion opening 308 and after the connecting rod 301. When air enters the insertion port 308, the first compression spring 305 may provide an elastic force for the force-bearing rod 302 through compression deformation, and further support the air baffle 307 by using the baffle column on the pull rod 306.

The spring hook 309 may be disposed on the connecting rod 301 and the housing 304, and the first compression spring 305 is separately hooked on the spring hook 309 on the connecting rod 301 and the spring hook 309 on the housing 304. A position of the spring hook 309 may be determined based on a specific scenario. This is not limited in this embodiment of this application. In FIG. 3C, an example in which the spring hook 309 is located on the housing 304 at the bottom of the device chassis after the connecting rod 301, and on the connecting rod 301 is used as an example.

The foregoing three disposition manners of the level-1 elastic component are merely examples for description. The level-1 elastic component is not limited to the foregoing three disposition manners. For example, the level-1 elastic component may be a rubber spring, and the rubber spring may abut against a side that is of the connecting rod and that is opposite to the insertion port, the force-bearing rod may be supported by using the rubber spring, and a supporting force is provided for the air baffle by using the pull rod on the connecting rod.

The level-1 elastic structure may be located between the insertion port and the air baffle, and when a module is inserted into the insertion port, the module first contacts the connecting rod, and then contacts the air baffle. For example, the connecting rod may be located directly in front of the air baffle facing the insertion port, and a hole is disposed on the air baffle, so that the pull rod may extend into the hole on the air baffle, and abut against a surface that is of the air baffle and that is opposite to the insertion port by using the baffle column on the pull rod. The connecting rod may also be located on a side surface of the air baffle, in other words, located on a side wall of the housing of the device chassis. The connecting rod is located before the air baffle in a module insertion direction.

The level-1 elastic structure may be disposed side by side with the air baffle. For example, the connecting rod and the air baffle are rotationally connected to the housing by using a same rotating shaft, but a force-bearing rod on the connecting rod is located before the air baffle in the module insertion direction. In other words, the force-bearing rod needs to be located between the air baffle and the insertion port. When a module is inserted from the insertion port, the module first contacts the force-bearing rod of the connecting rod, and then contacts the air baffle.

It should be noted that there are a plurality of positions for disposing the level-1 elastic structure. Any disposition manner in which the module first contacts the force-bearing rod of the connecting rod and then contacts the air baffle in a process of inserting the module after the level-1 elastic structure is disposed is applicable to this embodiment of this application.

In a possible implementation, when the module is inserted from the insertion port, because the force-bearing rod of the connecting rod is located before the air baffle along the module insertion direction, the module first contacts the force-bearing rod of the connecting rod, and pushes the connecting rod to rotate. Under a pushing action of the module, the pull rod is detached from a surface that is of the air baffle and that is opposite to the insertion port, and starts to rotate towards the housing. When the pull rod rotates to the housing, the connecting rod reaches a maximum movement limit, which is a contact point of a top of the force-bearing rod and the module. The module may continue to move, contact the air baffle, and rotates the air baffle by overcoming a function of the level-2 elastic component, and finally the module is completely inserted into the device chassis.

In the foregoing process of inserting the module, the module sequentially overcomes functions of the level-1 elastic component and the level-2 elastic component, and is finally inserted into the device chassis, so that the module does not need to provide a relatively large thrust in the insertion process. This is relatively convenient and labor-saving.

To ensure that the module can be relatively easy and labor-saving when pushing the force-bearing rod to move, a length of the force-bearing rod may be greater than a force-applying arm of the level-1 elastic component, so that the module is relatively easy to form a force-saving lever when pushing the force-bearing rod.

The force-applying arm of the level-1 elastic component is a distance from a support point of the lever to an action line of an action force of the level-1 elastic component. The support point of the lever is a point at which the lever rotates around. In the level-1 elastic structure shown in FIG. 3B, the support point of the lever is a connection point between the force-bearing lever and the housing. The force-applying arm of the level-1 elastic component is a vertical distance from the connection point to the first tension spring. It should be noted that, when specific shapes of and positions for disposing the level-1 elastic component are different, and force-applying arms of the level-1 elastic component are also different, when the module pushes the connecting rod, a position of the level-1 elastic component that forms the force-saving lever is applicable to this embodiment.

When the module is inserted into the insertion port, the module pushes the force-bearing rod, and after the pull rod rotates to the housing, the module contacts the air baffle. In other words, the module first contacts the level-1 elastic structure, and then contacts the level-2 elastic structure.

When the module contacts the level-1 elastic structure, the force-applying arm of the module for pushing the force-bearing rod is greater than the force-applying arm of the level-1 elastic component.

The force-applying arm of the module for pushing the force-bearing rod is a vertical distance from the support point of the lever to a straight line on which a force-applying point of the module is located. The straight line on which the force-applying point is located is parallel to the module insertion direction. In the level-1 elastic structure shown in FIG. 3B, the support point of the lever is the connection point between the force-bearing rod and the housing. The force-applying arm of the module for pushing the force-bearing rod is a vertical distance from the connection point to a straight line on which a contact point between the module and the force-bearing rod is located. As the module is inserted, the contact point between the module and the force-bearing rod moves, and the force-applying arm also changes.

When the module is inserted into the insertion port, and after a top of the pull rod rotates to the housing, the module contacts the air baffle, and the top of the force-bearing rod contacts a bottom of the module. The top of the pull rod contacts the housing, so that the connecting rod reaches a maximum movement limit, and the pull rod is in an extreme position and cannot continue to move. In this case, the top of the force-bearing rod contacts the bottom of the module, and gravity of the module applies force on the force-bearing rod in a vertical direction. In this way, the connecting rod maintains the maximum movement limit, and the maximum movement limit of the connecting rod can be maintained without increasing a thrust for pushing the module, and the thrust for the module can also be reduced. In this way, insertion of the module becomes labor-saving.

When the air baffle component includes a plurality of level-1 elastic structures, the plurality of level-1 elastic structures may all be located on a same side of the air baffle, in other words, located on a side wall of the same side of the housing, or may be distributed on two sides of the air baffle in a staggered manner, in other words, located on side walls of different sides of the housing. In addition, each force-bearing rod on the connecting rod in the level-1 elastic structure is located before the air baffle along the module insertion direction.

When the air baffle includes a plurality of level-1 elastic structures, in other words, includes a plurality of connecting rods and a plurality of level-1 elastic components, a baffle column is disposed on the pull rod, and the baffle column on the pull rod abuts against a surface that is of the air baffle and that is opposite to the insertion port, each connecting rod may provide a support force for the air baffle by using the level-1 elastic component.

By disposing a plurality of level-1 elastic structures, a support force required for maintaining an air baffle function of the air baffle may be allocated to the plurality of level-1 elastic structures and one level-2 elastic structure, and the support force is provided by the plurality of level-1 elastic components and one level-2 elastic component.

If the air baffle includes the plurality of level-1 elastic structures, when the module is inserted from the insertion port, the module may sequentially push the plurality of level-1 elastic structures, and then push the level-2 elastic structure. A force required for pushing the level-1 elastic structure each time is relatively small. In this way, it can be ensured that the air baffle can normally block air, and a force that needs to be overcome in a process of inserting the module is also relatively small. In this way, the insertion of the module becomes relatively easy.

When the plurality of level-1 elastic structures are disposed, a length, a width, and a height of each connecting rod and a distance between connecting rods may be adjusted based on a size of the device chassis. It only needs to be ensured that when the module pushes a former connecting rod, after a pull rod of the former connecting rod rotates to the housing, the pull rod contacts a latter connecting rod, and when the module pushes a connecting rod closest to the air baffle, after a pull rod on the connecting rod closest to the air baffle rotates to the housing, the module contacts the air baffle.

A shape of the connecting rod is not limited in this embodiment of this application. The connecting rod may be a T-shaped connecting rod. In FIG. 2 to FIG. 3C, the force-bearing rod and the pull rod are T-shaped connected.

Figure 4A:
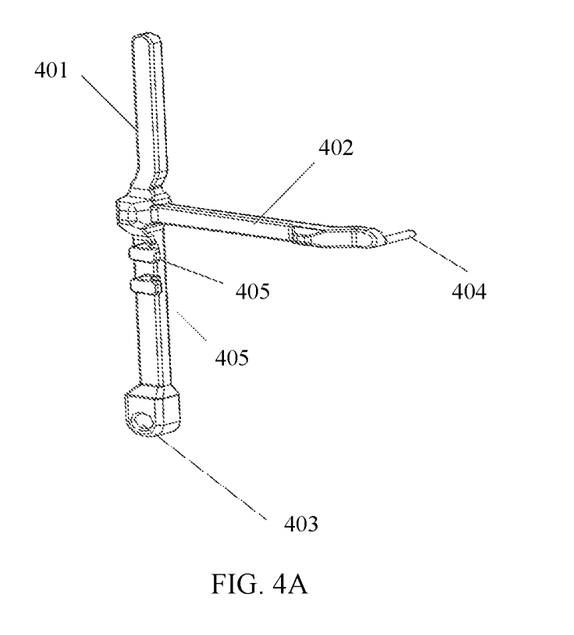
FIG. 4A to FIG. 4B are schematic structural diagrams of a connecting rod, in accordance with one or more embodiments.

FIG. 4A is a schematic structural diagram of a connecting rod according to an embodiment of this application. The connecting rod includes a force-bearing rod 401 and a pull rod 402. The force-bearing rod 401 and the pull rod 402 are T-shaped connected, and an included angle is 90 degrees. A rotating shaft hole 403 is disposed on the force-bearing rod 401, and the force-bearing rod 401 may be rotationally connected to a housing of a device chassis by using the rotating shaft hole 403. A baffle column 404 is disposed on a top of the pull rod 402. The baffle column 404 in FIG. 4A is cylindrical. Actually, a specific shape of the baffle column 404 is not limited. Any baffle column that can abut against a surface that is of an air baffle and that is opposite to an insertion port is applicable to this embodiment of this application.

If a level-1 elastic component in the air baffle component needs to be connected to the connecting rod, for example, the level-1 elastic component includes a first tension spring or a first compression spring, a spring hook 405 may be disposed on the connecting rod.

Certainly, the connecting rod may also be an S-shaped connecting rod. For example, the force-bearing rod and the pull rod are S-shaped. The connecting rod may also be a circular connecting rod. For example, the force-bearing rod and the pull rod are arc-shaped, and the force-bearing rod and the pull rod are connected to form the circular connecting rod. The connecting rod may also be an abnormal-shape connecting rod, for example, an included angle between the force-bearing rod and the pull rod is less than 90 degrees.

Figure 4B:
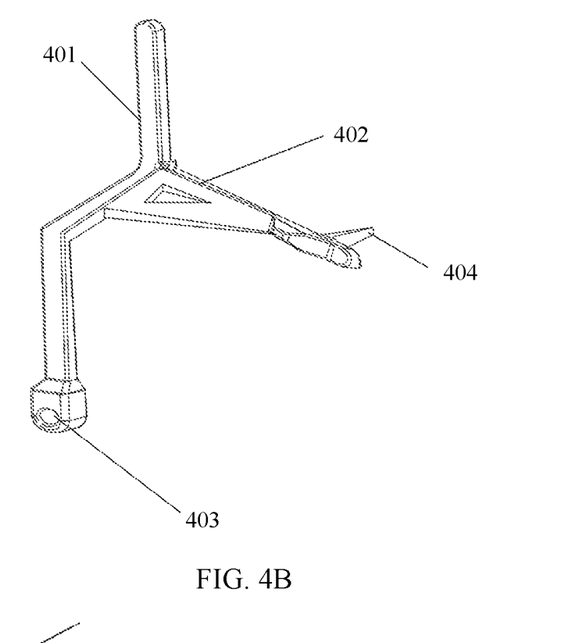

As shown in FIG. 4B, the connecting rod includes the force-bearing rod 401 and the pull rod 402, the force-bearing rod 401 is in a fold line shape, the pull rod 402 is a triangle, and the force-bearing rod 401 is connected to the pull rod 402. The rotating shaft hole 403 is disposed on the force-bearing rod 401, and the force-bearing rod 401 may be rotationally connected to the housing of the device chassis by using the rotating shaft hole 403. The baffle column 404 is disposed on the top of the pull rod 402, and the baffle column 404 in FIG. 4B is tapered.

It should be understood that shapes of the force-bearing rod and the pull rod are not limited to a straight rod, and may also be other shapes. For the force-bearing rod, any element that can contact a first module and that has a position that can be used as a force-bearing point may be used as a force-bearing rod. For example, the force-bearing rod may be an arc, a circle, or a triangle, or may be in another shape. This is not limited in this embodiment of this application. For the pull rod, any element that is connected to the force-bearing rod, that can extend to the air baffle, and that has the baffle column that can abut against a back-air surface of the air baffle may be used as a pull rod. A shape of the pull rod is not limited in this embodiment of this application.

In FIG. 4A to FIG. 4B, the baffle column is located on the top of the pull rod. In an actual application, a position of the baffle column on the pull rod is not limited. For example, the baffle column may be located on a middle position of the pull rod, or may be located on a middle and upper position of the pull rod. A disposition manner in which when a module is inserted from the insertion port, and the module pushes the force-bearing rod to reach a maximum movement limit of the force-bearing rod, the baffle column on the pull rod rotates to the housing is applicable to this embodiment of this application.

When a plurality of modules may be inserted into the insertion port of the device chassis, an example in which the first module is first inserted along a guide rail from the insertion port near a top of the device chassis is used for description. The first module first contacts the force-bearing rod, and the pull rod rotates under an action of the first module. When the connecting rod reaches a maximum movement limit, the first module contacts the air baffle, and sequentially overcomes action forces of a level-1 elastic component and a second elastic component, and is inserted into the device chassis. For the second module that is subsequently inserted, because the connecting rod reaches the maximum movement limit, and no force needs to be applied to the connecting rod, the second module directly contacts the air baffle, overcomes the action force of the second elastic component, and is inserted into the device chassis. In other words, the first module that is first inserted needs to apply force on the connecting rod, and the second module that is subsequently inserted does not need to apply force on the connecting rod.

To ensure that the first module can apply force on the connecting rod, and the second module does not apply force on the connecting rod, the connecting rod may be located on a side surface of the air baffle and close to a side wall of the housing of the device chassis. In other words, the force-bearing rod, the pull rod, and the level-1 elastic component (such as a first tension spring and a first compression spring) are located on a same plane, and the plane is parallel to the side wall of the housing of the device chassis. A horizontal column is disposed above the force-bearing rod, so that when the first module is inserted, the first module contacts the horizontal column to push the connecting rod. When the second module is inserted, because the force-bearing rod is close to the side wall of the housing of the device chassis, and the horizontal column is not disposed below the force-bearing rod, the second module does not contact the force-bearing rod.

To ensure that the first module can apply force on the connecting rod, and the second module does not apply force on the connecting rod, a shape of the force-bearing rod on the connecting rod may also be changed. For example, the connecting rod is located on the side surface of the air baffle and is close to the side wall of the housing of the device chassis, an upper half part of the force-bearing rod protrudes in the device chassis, and a lower half part of the force-bearing rod attaches to the side wall of the housing of the device chassis. The lower half part of the force-bearing rod on the connecting rod, the pull rod, and the level-1 elastic component (such as the first tension spring and the first compression spring) are located on a same plane, and the plane is parallel to the side wall of the housing of the device chassis.

The foregoing two manners of disposing the connecting rod are both examples for description. In addition, the first module is inserted from the insertion port near the top of the device chassis, which is only a prerequisite for conveniently describing a shape of the connecting rod. A position and a sequence of inserting the module are not limited in this embodiment of this application. A design manner in which it can be ensured that a module first inserted into the insertion port pushes the connecting rod to move, and a module subsequently inserted into the insertion port does not push the connecting rod is applicable to this embodiment of this application.

Figure 5:
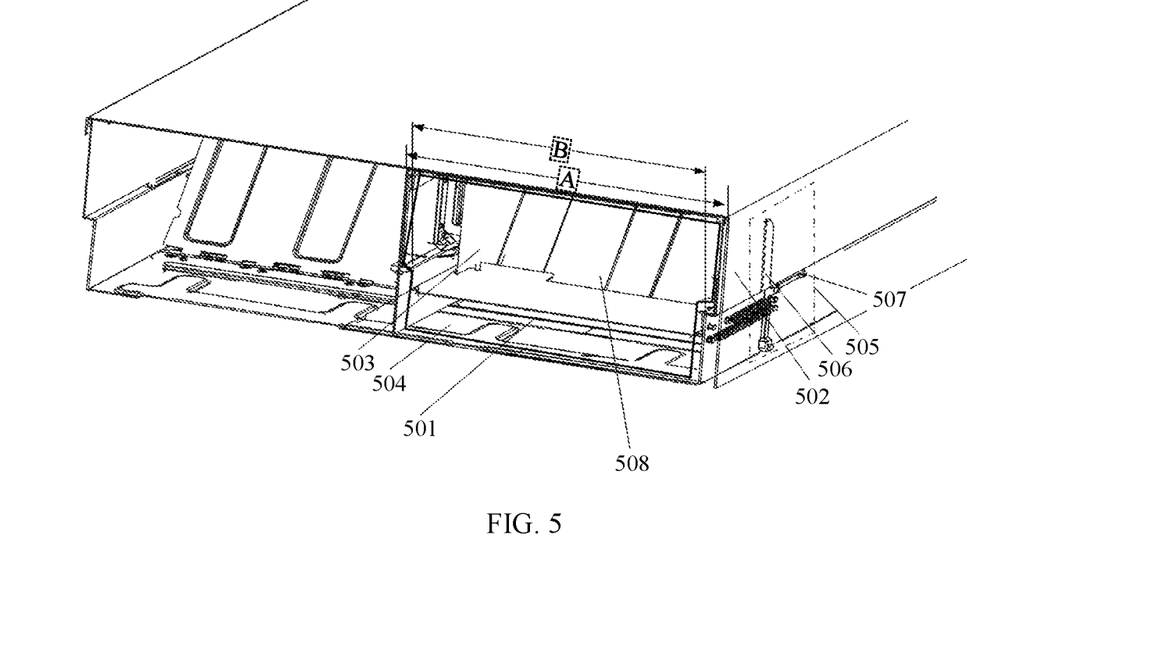
FIG. 5 is a schematic structural diagram of a device chassis and a connecting rod, in accordance with one or more embodiments.

This embodiment of this application is not limited to the foregoing two manners. In actual application, a shape of the pull rod may be designed based on a size of the device chassis, a size of the first module, and a size of the second module. For example, two modules may be inserted into the insertion port of the device chassis: the first module and the second module. It is assumed that the first module is a module inserted from the insertion port near the top of the device chassis, and the second module is a module inserted from the insertion port near a bottom of the device chassis. If the first module is greater than a width of the second module, the insertion port of the device chassis is of an inverted-convex structure. As shown in FIG. 5, a module insertion port 501 of the device chassis is of the inverted-convex structure, and a side wall 502 of the housing of the device chassis is of a step shape. A width A of an upper half part 503 of the device chassis is greater than a width B of a lower half part 504 of the device chassis. a connecting rod 505 is close to the side wall 502 of the housing of the lower half part 504 of the device chassis, and is located outside the side wall 502 of the housing of the lower half part 504 of the device chassis. A force-bearing rod 506 of the connecting rod 505 extends in the chassis device (in FIG. 5, a dashed line is used to indicate a part of the force-bearing rod 506 extending in the chassis device), which is close to the side wall 502 of the housing of the upper half part 503 of the chassis device, and is located on an inner side of the side wall 502 of the housing of the upper half part 503 of the device chassis. When the first module is inserted from the insertion port of the device chassis, because the first module and the second module are not equal in width, the first module contacts the force-bearing rod 506 on the connecting rod 505 to push a connecting rod 507 to move. Because the connecting rod 505 is close to the side wall 502 of the housing of the lower half part 504 of the device chassis, when the second module is inserted from the insertion port 501, the second module does not push the connecting rod 507 to move, and only pushes an air baffle 508, and the second module is inserted into the device chassis.

It should be noted that in the foregoing description, "upper" is a position close to the top of the device chassis, and "lower" is a position close to the bottom of the device chassis.

For example, the following lists manners of disposing the level-2 elastic component in the level-2 elastic structure.

Figure 6A:
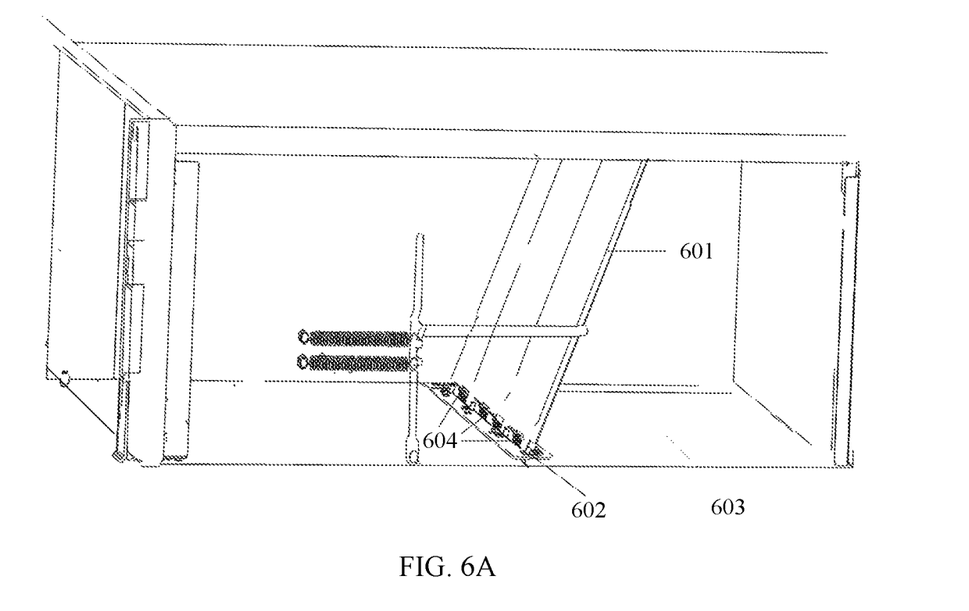
FIG. 6A to FIG. 6C are schematic structural diagrams of a level-2 elastic component, in accordance with one or more embodiments.

In a first manner, the level-2 elastic component includes a second torsion spring.

As shown in FIG. 6A, an air baffle 601 is rotationally connected to a housing 603 of the device chassis by using a second rotating shaft 602. The level-2 elastic component includes one or more second torsion springs 604. In FIG. 6A, an example in which the level-2 elastic component includes three second torsion springs 604 is used for description. The second torsion spring 604 is sleeved on the second rotating shaft 602, and two ends of the second torsion spring 603 respectively abut against the air baffle 601 and the housing 603.

Figure 6B:
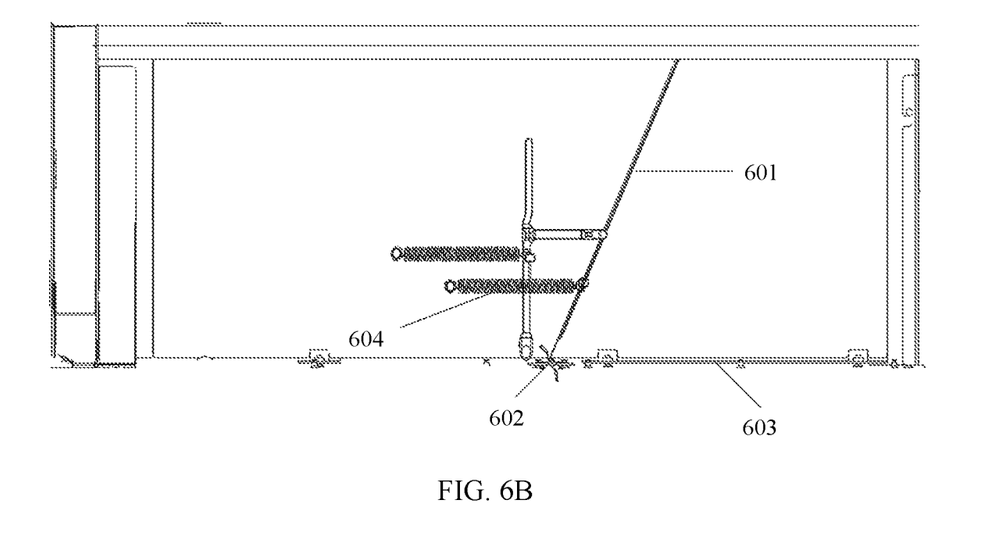

The second torsion spring 604 is sleeved on the second rotating shaft 602, to provide a support force for the air baffle 601, so as to prevent the air baffle 601 from moving under an action of air. When the module is inserted from the insertion port, after contacting the connecting rod, the module contacts the air baffle 601, and the module can be completely inserted into the device chassis by overcoming an action force of the second torsion spring 604. This ensures that the air baffle can normally block the air and insertion of the module is labor-saving In a second manner, the level-2 elastic component includes a second tension spring.

As shown in FIG. 6B, the air baffle 601 is rotationally connected to the housing 603 of the device chassis by using the second rotating shaft 602. The level-2 elastic component includes one or more second tension springs 604. In FIG. 6B, an example in which the level-2 elastic component includes one second tension spring 604 is used for description. Two ends of the second tension spring 604 are respectively connected to the air baffle 601 and the housing 603.

To ensure that the second tension spring 604 can provide a support force for the air baffle through tensile deformation, one end of the second tension spring needs to be connected to the air baffle 601, and the other end needs to be connected to the housing 603, and is connected to a position that is on the housing 603 and that faces the insertion port and that is located before the air baffle. A spring hook may be disposed on the housing 603 and the air baffle 601, and the second tension spring 604 is hooked on the spring hook.

When air enters the insertion port, the second tension spring 604 pulls the air baffle 601 to prevent the air baffle 601 from moving. When the module is inserted from the insertion port, the module can be inserted into the insertion port by overcoming only an action force of the second tension spring 604 after overcoming an action force of the level-1 elastic component.

Figure 6C:
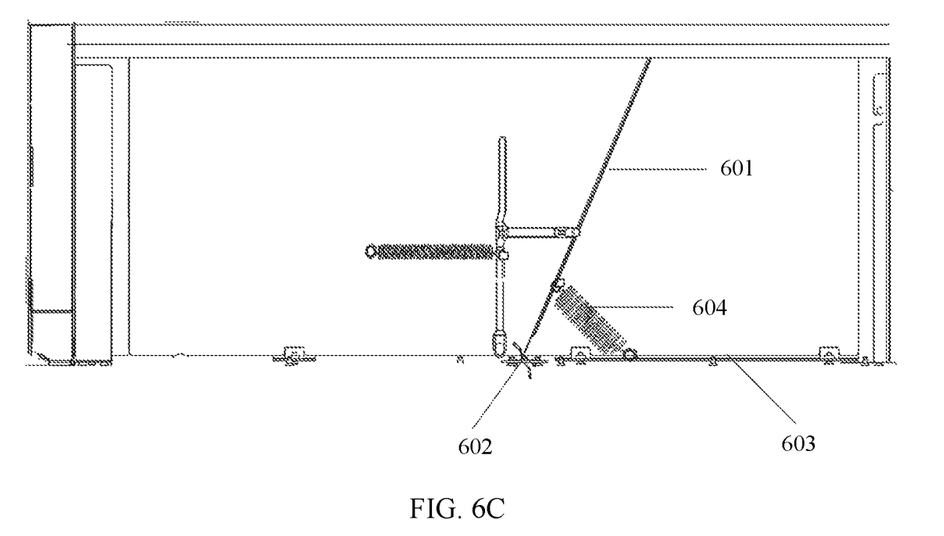

In a third manner, the level-2 elastic component includes a second compression spring.

As shown in FIG. 6C, the air baffle 601 is rotationally connected to the housing 603 of the device chassis by using the second rotating shaft 602. The level-2 elastic component includes one or more second compression springs 604. In FIG. 6C, an example in which the level-2 elastic component includes one second compression spring 604 is used for description. Two ends of the second compression spring 604 are respectively connected to the air baffle 601 and the housing 603.

The second compression spring 604 provides a support force for the air baffle 601 through compression deformation, the second compression spring 604 is in a compressed state, and the second compression spring 604 needs to abut against the air baffle 601 and the housing 603. A position on which the second compression spring 604 is connected to the housing 603 should be far away from the insertion port and after the air baffle 601. For example, a position on which the second compression spring 604 is connected to the housing 603 may be located at a bottom of the device chassis, as shown in FIG. 6C, or may be located on a side wall of the housing 603 of the device chassis.

In this embodiment of this application, three disposition manners of the level-1 elastic component and three disposition manners of the level-2 elastic component are separately described. There is no direct relationship between disposing the level-1 elastic component and disposing the level-2 elastic component. A disposition manner of the level-1 elastic component may be selected based on a specific application scenario. Likewise, a disposition manner of the level-2 elastic component may also be selected based on an application scenario. For example, when the level-1 elastic component may include the first tension spring, the level-2 elastic component also includes the second tension spring. When the level-1 elastic component may include the first torsion spring, the level-2 elastic component also includes the second torsion spring. When the level-1 elastic component may include the first torsion spring, the level-2 elastic component includes the second tension spring. There are a plurality of combination manners. This is not limited in this embodiment of this application.

An example embodiment of an air baffle component is used below to describe a working principle of the air baffle component when a module is inserted from the insertion port.

There may be one or more modules that can be inserted into an insertion port, and corresponding to different quantities of modules, positions of components in the air baffle component are different. The following separately describes working principles of the air baffle component by using two modules that can be inserted into the insertion port and only one module that can be inserted into the insertion port.

Figure 7A:
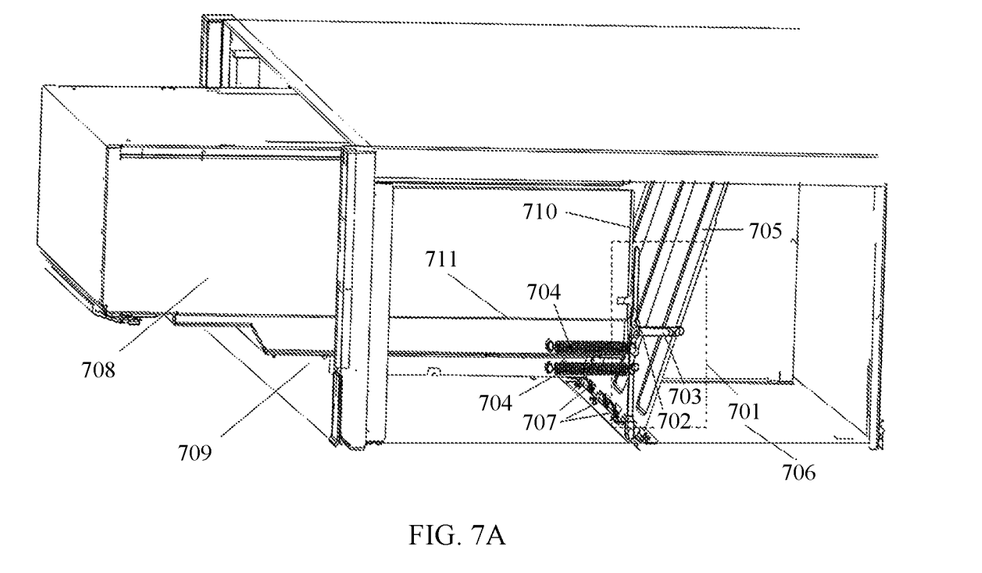
FIG. 7A to FIG. 7C are schematic structural diagrams of an air baffle component, in accordance with one or more embodiments.

In a first implementation, two modules may be inserted into the insertion port.

FIG. 7A is a schematic structural diagram of an air baffle component. The air baffle component includes a level-1 elastic structure and a level-2 elastic structure. A connecting rod 701 is a T-shaped connecting rod, and a force-bearing rod 702 and a pull rod 703 of the connecting rod 701 are vertically connected. A level-1 elastic component includes two first tension springs 704. In the level-2 elastic structure, an air baffle 705 is rotationally connected to a housing 706, and a level-2 elastic component includes a plurality of second torsion springs 707. When a first module 708 is inserted into the insertion port 709, the first module 708 first pushes the force-bearing rod 702, so that the connecting rod 701 moves, and the pull rod 703 rotates.

It should be noted that, when the first module 708 pushes the force-bearing rod 702, a contact point between the force-bearing rod 702 and the first module 708 moves with insertion of the first module 708, and the contact point between the force-bearing rod 702 and the first module 708 moves from a surface 710 that is of the first module 708 and that is parallel to the insertion port 709 to a surface that is of the first module 708 and that is perpendicular to the insertion port 709 (a bottom surface 711 of the first module 708). When the pull rod 703 rotates to the housing 706 of the device chassis under an action of the first module 708, a contact point between a top of the force-bearing rod 702 and the first module 708 is at a junction of the surface 710 that is of the first module 708 and that is parallel to the insertion port and the bottom surface 711 of the first module 708. When the first module 708 continues to be inserted, the contact point moves to the bottom surface 711 of the first module 708, and the top of the force-bearing rod 702 contacts the bottom surface 711 of the first module 708.

In other words, when the pull rod 703 rotates to the housing 706 of the device chassis, the first module 708 no longer applies force on the force-bearing rod 702 in an insertion direction.

Figure 7B:
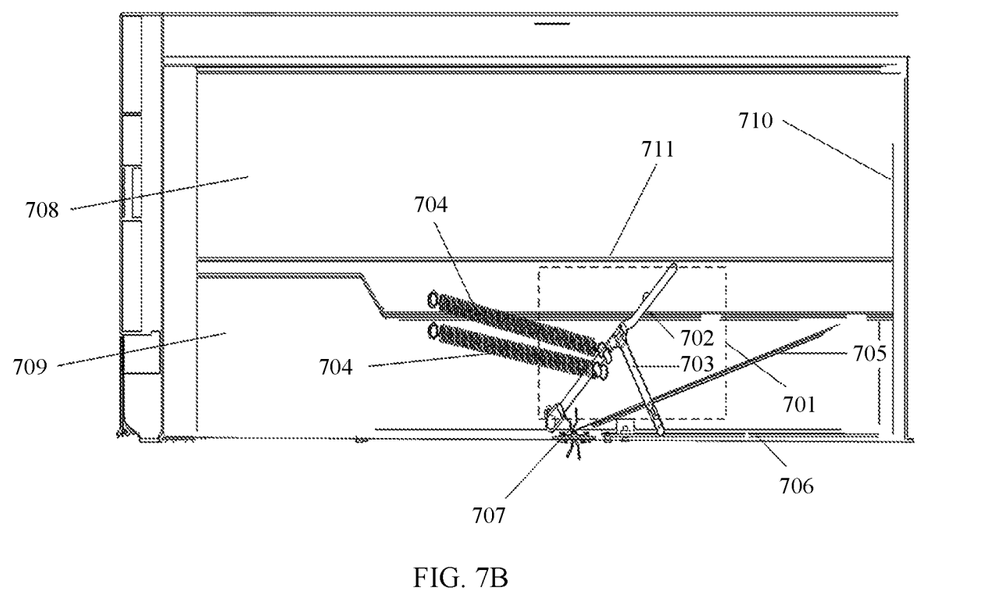

FIG. 7B is a schematic cross-sectional structural diagram of the device chassis along a module insertion direction. When the first module 708 in FIG. 7B is completely inserted into the insertion port 709, the pull rod 703 rotates to the housing 706, the top of the force-bearing rod 702 contacts the bottom of the first module 708 (the bottom surface 711 of the first module 708), and the connecting rod 701 reaches a maximum movement limit.

Figure 7C:
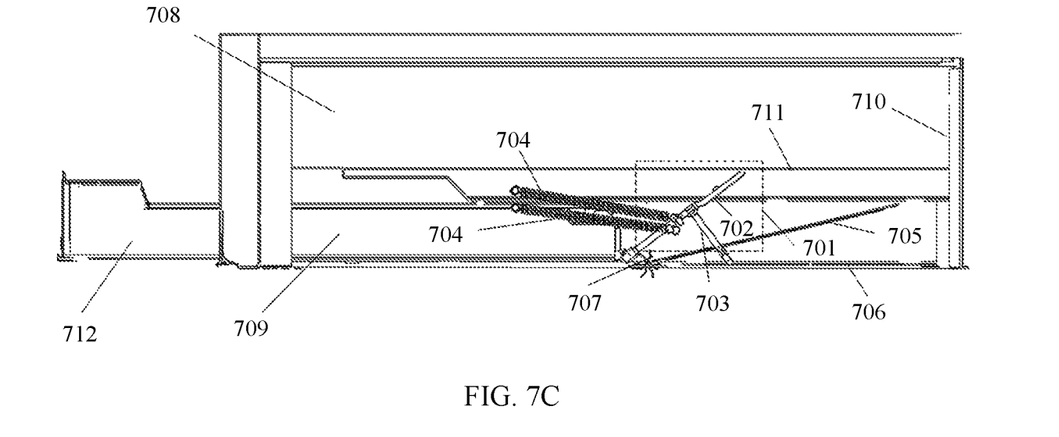

FIG. 7C is a schematic cross-sectional structural diagram of the device chassis along a module insertion direction. In FIG. 7C, a second module 712 is inserted into the insertion port 709, and the second module 712 does not contact the force-bearing rod 702 of the connecting rod 701. In other words, the second module 712 directly contacts the air baffle 705 instead of pushing the connecting rod 701 to move. The second module 712 can be completely inserted into the device chassis only by overcoming a force of the second torsion spring 707.

As shown in FIG. 7A to FIG. 7C, when two modules are allowed to be inserted into the insertion port, the first inserted module needs to push the connecting rod and the air baffle, and a distance between the connecting rod and the air baffle needs to enable the module to contact the air baffle after the pull rod reaches the housing when the module is inserted. For the subsequently inserted module, because the connecting rod has reached the maximum movement limit, the subsequently inserted module only needs to overcome an action force of the second torsion spring. In this way, insertion of the two modules is relatively labor-saving. A case in which three or more modules are allowed to be inserted into the insertion port is similar to a case in which two modules are allowed to be inserted into the insertion port. Details are not described herein again.

Figure 8:
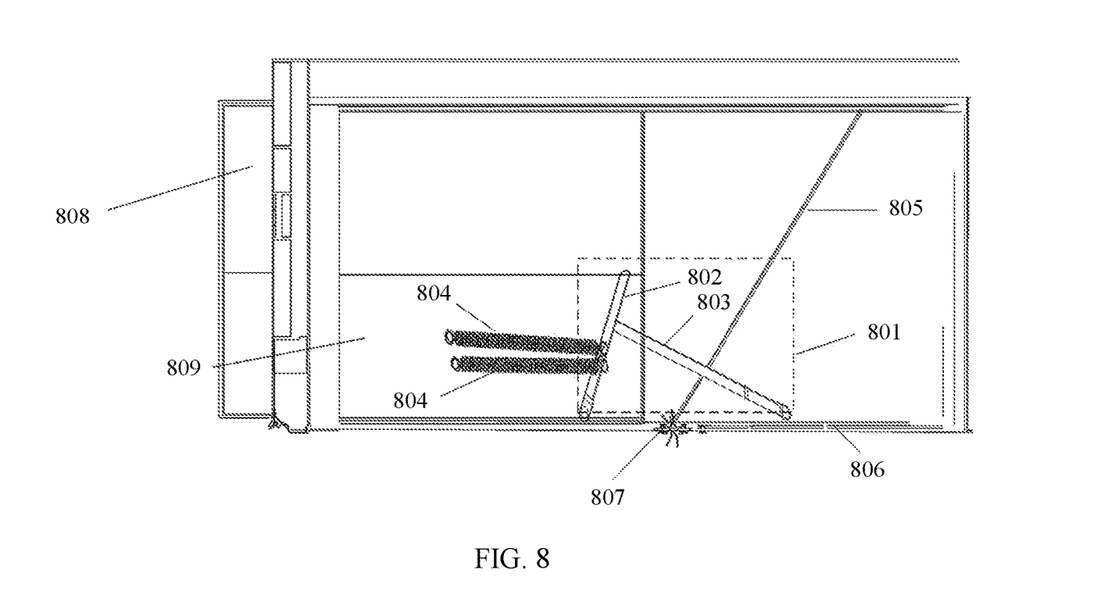
FIG. 8 is a schematic structural diagram of an air baffle component, in accordance with one or more embodiments.

In a second implementation, only one module can be inserted into the insertion port.

As shown in FIG. 8, an air baffle component includes a level-1 elastic structure and a level-2 elastic structure. A connecting rod 801 is an abnormal-shape connecting rod, and an included angle between a force-bearing rod 802 and a connecting rod 803 is less than 90 degrees. A level-1 elastic component includes two first tension springs 804. In the level-2 elastic structure, an air baffle 805 is rotationally connected to a housing 806, and a level-2 elastic component includes a plurality of second torsion springs 807.

When a first module 808 is inserted into an insertion port 809, the first module 808 first pushes the force-bearing rod 802, the connecting rod 801 moves, and the pull rod 803 rotates. After the pull rod 803 rotates to the housing 806, the first module 808 continues to push forward and contacts the air baffle 805.

As shown in FIG. 8, when only one module is inserted into the insertion port, a distance between the connecting rod and the air baffle needs to enable the module to contact the air baffle after the pull rod reaches the housing when the module in inserted.

An embodiment of this application further provides a heat dissipation apparatus, and the heat dissipation apparatus may include the air baffle component provided in any one of the foregoing embodiments. The heat dissipation apparatus further includes a fan and an air duct. Air that flows out from the fan may flow through the air duct, and the air baffle component may be disposed at a position that does not require air to cooperate with the air duct, so that the air can flow.

An embodiment of this application further provides a server, and the server may include the heat dissipation apparatus. The heat dissipation apparatus includes the air baffle component provided in any one of the foregoing embodiments. The server may further include one or more processors or another processing module. To ensure normal heat dissipation of the processor or the processing module in the server, the heat dissipation apparatus is disposed in the server to cool down the processor or the processing module.

The foregoing descriptions are merely example implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An air baffle component, comprising:
    an air baffle rotatably connected to a housing having a module insertion port;
    a level-1 elastic component;
    a level-2 elastic component; and
    a connecting rod, comprising:
        a force-bearing rod rotatably connected to the housing between the air baffle and the module insertion port; and
        a pull rod connected to the force-bearing rod; and
        a baffle column on the pull rod,
    wherein
        the level-1 elastic component is in contact with the connecting rod and the housing, and provides a first elastic force for the force-bearing rod, so that the baffle column is caused to abut against a surface of the air baffle opposite to the module insertion port, and
        the level-2 elastic component is in contact with the housing and the air baffle, provides a second elastic force for the air baffle.

2. The air baffle component according to claim 1, wherein the module insertion port is configured to receive a module configured to push the force bearing rod, and the air baffle component is configured such that when the module is inserted into the module insertion port with an insertion force greater than the first elastic force, the module pushes the force-bearing rod, the pull rod rotates toward the housing, and the module contacts the air baffle.

3. The air baffle component according to claim 2, wherein the air baffle component is configured such that when the module is inserted into the module insertion port with the insertion force greater than the first elastic force, a top of the pull rod rotates toward the housing, and after the top of the pull rod rotates toward the housing, the module contacts the air baffle and a top of the force-bearing rod contacts a bottom of the module.

4. The air baffle component according to claim 1, wherein the force-bearing rod is rotatably connected to the housing by way of a rotating shaft, and
    the level-1 elastic component comprises a torsion spring, the torsion spring is sleeved onto the rotating shaft, a first end of the torsion spring abuts against the connecting rod, and a second end of the torsion spring abuts against the housing.

5. The air baffle component according to claim 1, wherein the level-1 elastic component comprises a tension spring, a first end of the tension spring is connected to the connecting rod, and a second end of the tension spring is connected to the housing.

6. The air baffle component according to claim 1, wherein the level-1 elastic component comprises a compression spring, a first end of the compression spring is connected to the connecting rod, and a second end of the compression spring is connected to the housing.

7. The air baffle component according to claim 1, wherein the connecting rod is on a side wall of the housing.

8. The air baffle component according to claim 1, wherein the connecting rod is T-shaped, S-shaped, circular, or abnormally-shaped.

9. The air baffle component according to claim 1, wherein the air baffle is rotatably connected to the housing by way of a rotating shaft, and
    the level-2 elastic component comprises a torsion spring, the torsion spring is sleeved onto the rotating shaft, a first end of the second torsion spring abuts against the air baffle, and a second end of the torsion spring abuts against the housing.

10. The air baffle component according to claim 1, wherein the level-2 elastic component comprises a tension spring, a first end of the tension spring is connected to the air baffle, and a second end of the tension spring is connected to the housing.

11. The air baffle component according to claim 1, wherein the level-2 elastic component comprises a compression spring, a first end of the compression spring is connected to the air baffle, and a second end of the compression spring is connected to the housing.

12. A heat dissipation apparatus, comprising:
an air baffle component, comprising:
an air baffle rotatably connected to a housing having a module insertion port;
a level-1 elastic component;
a level-2 elastic component; and
a connecting rod, comprising:
a force-bearing rod rotatably connected to the housing between the air baffle and the module insertion port; and
a pull rod connected to the force-bearing rod; and
a baffle column on the pull rod,
wherein
the level-1 elastic component is in contact with the connecting rod and the housing, and provides a first elastic force for the force-bearing rod, so that the baffle column is caused to abut against a surface of the air baffle opposite to the module insertion port of the housing, and
the level-2 elastic component is in contact with the housing and the air baffle, and provides a second elastic force for the air baffle.

13. A server, comprising:
a housing having a module insertion port; and
an air baffle component, the air baffle component comprising:
an air baffle rotatably connected to the housing;
a level-1 elastic component;
a level-2 elastic component; and
a connecting rod, comprising:
a force-bearing rod rotatably connected to the housing between the air baffle and the module insertion port; and
a pull rod connected to the force-bearing rod; and
a baffle column on the pull rod,
wherein
the level-1 elastic component is in contact with the connecting rod and the housing, and provides a first elastic force for the force-bearing rod, so that the baffle column is caused to abut against a surface of the air baffle opposite to the module insertion port, and
the level-2 elastic component is in contact with the housing and the air baffle, and provides a second elastic force for the air baffle.

14. The server according to claim 13, wherein the module insertion port is configured to receive a module configured to push the force bearing rod, and the air baffle component is configured such that when the module is inserted into the module insertion port with an insertion force greater than the first elastic force, the module pushes the force-bearing rod, the pull rod rotates toward the housing, and the module contacts the air baffle.

15. The server according to claim 14, wherein the air baffle component is configured such that when the module is inserted into the module insertion port with the insertion force greater than the first elastic force, a top of the pull rod rotates toward the housing, and after the top of the pull rod rotates toward the housing, the module contacts the air baffle and a top of the force-bearing rod contacts a bottom of the module.

16. The server according to claim 13, wherein the force-bearing rod is rotatably connected to the housing by way of a rotating shaft, and
the level-1 elastic component comprises a torsion spring, the torsion spring is sleeved onto the rotating shaft, a first end of the torsion spring abuts against the connecting rod, and a second end of the torsion spring abuts against the housing.

17. The server according to claim 13, wherein the level-1 elastic component comprises a tension spring, a first end of the tension spring is connected to the connecting rod, and a second end of the tension spring is connected to the housing.

18. The server according to claim 13, wherein the level-1 elastic component comprises a compression spring, a first end of the compression spring is connected to the connecting rod, and a second end of the compression spring is connected to the housing.

19. The server according to claim 13, wherein the connecting rod is on a side wall of the housing.

* * * * *